(12) United States Patent
Chidambarrao et al.

(10) Patent No.: US 6,974,981 B2
(45) Date of Patent: Dec. 13, 2005

(54) ISOLATION STRUCTURES FOR IMPOSING STRESS PATTERNS

(75) Inventors: Dureseti Chidambarrao, Weston, CT (US); Omer H. Dokumaci, Wappingers Falls, NY (US); Bruce B. Doris, Brewster, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 10/318,600

(22) Filed: Dec. 12, 2002

(65) Prior Publication Data

US 2004/0113174 A1 Jun. 17, 2004

(51) Int. Cl.[7] .......................................... H01L 29/774
(52) U.S. Cl. ...................... 257/265; 257/274; 257/324; 257/330; 257/374; 438/154
(58) Field of Search ................................ 257/374, 375; 438/207, 218

(56) References Cited

U.S. PATENT DOCUMENTS

| | | |
|---|---|---|
| 6,057,581 A | 5/2000 | Doan |
| 6,075,262 A | 6/2000 | Moriuchi et al. |
| 6,258,695 B1 | 7/2001 | Dunn et al. |

OTHER PUBLICATIONS

IEDM 2000 "Mechanical stress effect of etch-stop nitride and its impact on deep submicron transistor design", Ito et al., NEC Corporation, ppgs 10.7.01-10.7.4.
IEEE Transactions on Electron Devices, vol. 38, No. 4, Apr. 1991, "A new aspect of mechanical stress effects in scaled MOS devices", Hamada et al. ppgs. 895-900.
2001 Symposium on VLSI Technology Digest of Technical Papers "Strained Si NMOSFETs for high performance CMOS technology", Rim et al., ppgs. 59-60.
J. Appl. Phys. vol. 70, No. 6, Sep. 15, 1991, "Stress-related problems in silicon technology", ppgs R53-R80.

*Primary Examiner*—Fetsum Abraham
(74) *Attorney, Agent, or Firm*—Jay H. Anderson; Eugene Shkurko

(57) ABSTRACT

A substrate under tension and/or compression improves performance of devices fabricated therein. Tension and/or compression can be imposed on a substrate through selection of appropriate STI fill material. The STI regions are formed in the substrate layer and impose forces on adjacent substrate areas. The substrate areas under compression or tension exhibit charge mobility characteristics different from those of a non-stressed substrate. By controllably varying these stresses within NFET and PFET devices formed on a substrate, improvements in IC performance are achieved.

2 Claims, 4 Drawing Sheets

ISOLATION STRUCTURES FOR IMPOSING STRESS PATTERNS

CROSS REFERENCE TO RELATED APPLICATIONS

U.S. patent application Ser. No. 10/318,602, entitled "Stress Inducing Spacers" filed concurrently herewith is assigned to the same assignee hereof and contains subject matter related, in certain respect, to the subject matter of the present application. The above-identified patent application is incorporated herein by reference.

BACKGROUND OF THE INVENTION

1. Technical Field of the Invention

This invention pertains to inventive methods of manufacturing a semiconductor device for improving device performance, and to the resulting unique high-performance device structure. In particular, this invention has improved charge mobility in FET devices by structurally imposing tensile and compression forces in a device substrate during device fabrication.

Within the field of semiconductor device design, it is known that mechanical stresses within the device substrate can modulate device performance. Individual stress tensor components affect device behavior of PFETs and NFETs differently. Previous improvements that utilized stress enhancements tended to focus on one or the other type of device outside of a practical performance environment, such as in an IC chip. In order to maximize the performance of both PFETs and NFETs within IC chips, the stress components need to be engineered and applied differently, yet simultaneously. In the present invention we show fabrication methods and resulting structures that have imposed the appropriate stress fields needed to improve the performance of a single device and of at least two devices simultaneously in a common substrate.

2. Description of the Prior Art

Hamada et al, IEEE Transactions on Electron Devices, Vol. 38 No. 4, *A New Aspect of Mechanical Stress Effects in Scaled MOS Devices* (April 1991) show data correlating weight induced (bending a sample silicon chip) longitudinal and transverse tensile and compressive stress with Transconductance deviation. Within the PFET device a longitudinally applied uniaxial compressive stress had an effect reversed from the effect induced on an NFET. This data can be interpreted such that if you apply an in-plane biaxial tensile stress, the NFET device performance will improve about two-fold as compared to that of a uniaxial tensile situation, while the PFET experiences no change because the longitudinal and transverse tensile stress effects cancel each other out.

In the Symposium on VLSI Technology Digest of Technical Papers (2001), Rim et. al. shows that, using strained Si which has in-plane biaxial tensile stress, improvements occurred for an NFET with a 70% increase in electron mobility. Prior known solutions and methods using mechanical stress for device performance enhancement could not improve both NFETs and PFETs simultaneously. Moreover, prior solutions do not address the feasibility of any kind of device structures or methods of fabricating them.

SUMMARY OF THE INVENTION

In this invention we show methods and structures by which we have applied in-plane biaxial (two-dimensional) tensile stress for the NFET while at the same time applying in-plane compressive longitudinal stress and a tensile transverse stress on the PFET device. The structures and methods of making each device individually is also unique. The primary advantage of these methods and structures is that they have provided two-fold device performance improvement relative to merely uniaxial stresses. Another advantage is the method for fabricating NFETs and PFETs simultaneously on a common substrate, wherein each device is designed to enhance performance using stress inducing isolation material. A secondary advantage is the structure and method of building an individual device with enhanced performance provided via stress inducing trench isolation structures.

It is an object of the present invention to provide device performance improvements for NFETs, PFETs, and for both NFETs and PFETs simultaneously. It is another object of the present invention to be readily integratible into present manufacturing processes cheaply for significant device performance improvements by adding a single mask step. It is another object of the present invention to be manufacturable in bulk silicon, silicon-on-insulator ("SOI"), and strained silicon structures.

This invention comprises a trench isolation structure for an NFET device and for a PFET device. An isolation region for the NFET device contains therein a first isolation material which applies a first type of mechanical stress on the NFET device in a longitudinal direction and in a transverse direction. A first isolation region for the PFET device applies mechanical stress on the PFET device in the transverse direction. A second isolation region for the PFET device applies another type of mechanical stress on the PFET device in the longitudinal direction. The isolation regions may comprise similar or different isolation materials depending upon which type of mechanical stress is desired. Typically, the mechanical stresses are either tensile or compressive.

In another aspect, this invention comprises a method for making NFET and PFET devices. This aspect incorporates the formation of isolation regions at the sides and at the ends of the NFET device. Another isolation region is formed at the sides of the PFET device. Another (third) trench isolation region is formed at the ends of the PFET device. Isolation materials in these isolation regions are selected to apply a first type of mechanical stress on the NFET device both in a longitudinal direction and in a transverse direction, and on the PFET device in the transverse direction. Isolation material in the third trench isolation region can be selected to apply a compressive type of mechanical stress in the longitudinal direction of the PFET. In another method of inducing stress vectors, it is useful to oxidize, in order to expand, at least a portion of the isolation material in the third trench isolation region to apply the compressive mechanical stress on the PFET device in the longitudinal direction. Thus, the isolation materials selected may be the same or different for each device depending on whether oxidation is used to induce stress components.

In another aspect, the present invention comprises source and drain regions formed in a substrate. The substrate having a channel region between each of the source and drain regions. A gate region adjacent the channel region controls conduction through the channel region. Stress inducing isolation material adjacent selected sides of the source and drain regions imparts stress, i.e. tension or compression, beyond the source and drain regions of the substrate at least into the channel region.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
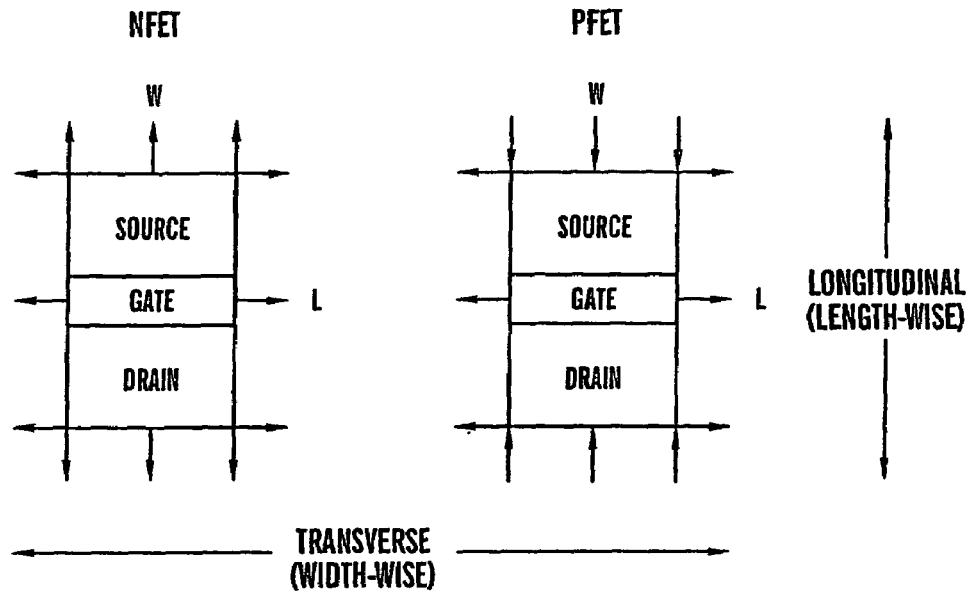
FIG. 1 illustrates desired stress states that improve performance of PFETs and NFETs, wherein the outward arrows from the device active area illustrate tension, and inward arrows toward the device area illustrate compression, and W and L illustrate width and length of the active area of the device, respectively.

The present invention involves filling isolation regions, preferably shallow trench isolation ("STI") with different intrinsically stress inducing materials to impart selected longitudinal and transverse stress components upon active device regions formed in a substrate. For example, using a stress inducing material that is intrinsically tensile causes a tensile state of stress in the substrate and an intrinsically compressive material causes compression in the substrate. In order to impart these different stresses in devices, we use deposited films that impose different intrinsic stresses. For example, TEOS (TETRAETHYLORTHOSILICATE) is known to be tensile because it undergoes densification under anneal and so it shrinks, thereby imposing upon an adjacent substrate a tensile stress. HDP (High density Plasma) oxide is known to be intrinsically compressive. The key here is to integrate two different intrinsically stress inducing structures adjacent the NFET and PFET structures or, individually, one or two stress inducing structures adjacent one of these devices. The process steps for integrating TEOS, which has tensile intrinsic stress, and HDP, which has compressive intrinsic stress, are shown and described below in FIGS. 3–7 and the accompanying specification.

The present inventive method also includes a novel STI process flow that results in a SiN (silicon nitride) liner for both transverse and longitudinal components for NFETs but only in a transverse component for PFETs. This process incorporates TEOS for the STI fill because TEOS is permeable to $O_2$ and the SiN liner prevents oxidation from occurring at the Si/TEOS boundary. Therefore, only the longitudinal component of the PFET will be oxidized, which causes the Si/TEOS boundary to expand. The amount and time of oxidation can be used to controllably increase the compressive stress for the PFET in the longitudinal direction. Also, since TEOS is intrinsically a tensile film and a SiN liner is used for both transverse and longitudinal components of the NFET and the transverse component of the PFET, there will be a tensile stress exerted by the TEOS STI in these directions.

Structure

Standard STI processes typically utilize a single type of oxide film (a nitride liner is optional) for isolation together with an isolation fill material. In the present invention, different types of oxide film are selectively placed in substrate regions surrounding FET devices. By controlling the fabrication process conditions, the type of stress imparted to adjacent FET devices can also be controlled.

NFET and PFET devices require different stress vectors, or patterns, to enhance charge mobility. The isolation material can be fined tuned to produce a desired stress pattern in the device. Some materials are amenable to further fine tuning via process controls, such as RF power, for example. TEOS is harder to fine tune via process controls because it's a loosely structured material, but it tends to shrink when densified (annealed), thereby imparting one type of intrinsic stress—tensile. HDP is somewhat more controllable than TEOS, it also does not require densification (heat treatment) and typically provides intrinsic compressive stress.

FIG. 1 illustrates a preferred embodiment of the present invention. The outwardly directed arrows, shown extending from the NFET, illustrate a tensile stress that is induced in the transverse and longitudinal directions of the device. As will be further described, TEOS can be utilized in the present inventive method to impose these stresses in an NFET. TEOS is also applied, abutting or adjacent to, the transverse sides of the PFET to produce transverse tensile vectors in the PFET. HDP is formed adjacent the longitudinal sides of the PFET to produce longitudinal compression vectors in the PFET.

In another embodiment, the end structure comprises an NFET with SiN liner on both longitudinal and transverse components, a PFET with SiN liner on transverse component, and oxidized Si with no SiN liner on the longitudinal component. Several process flows are possible to arrive at the final structure.

Figure 6:
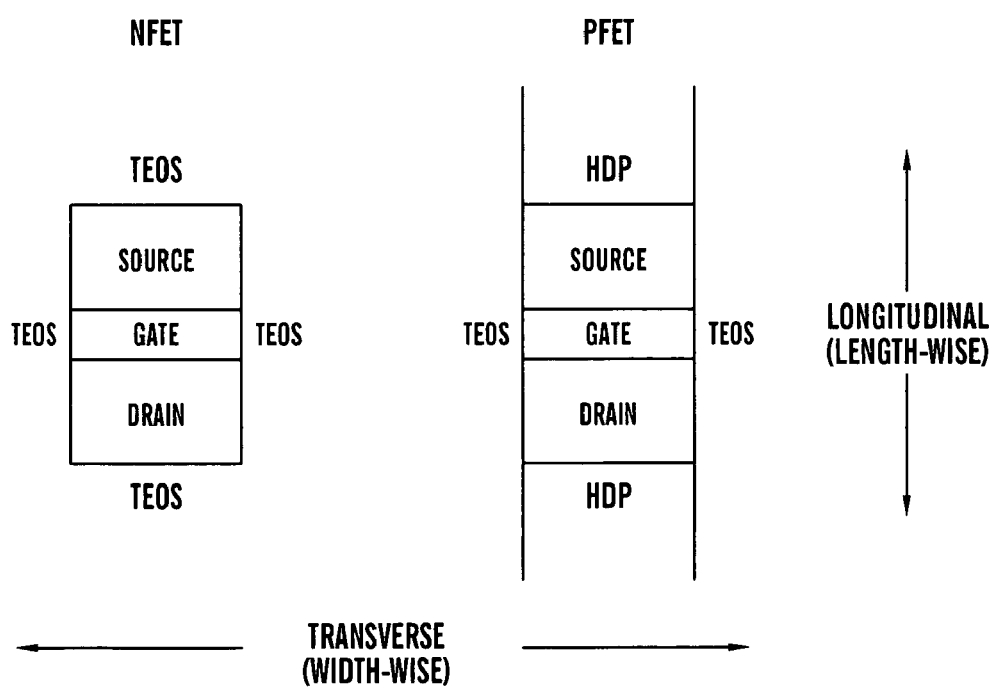
FIG. 6 illustrates a structural top view of the devices of FIG. 1 showing the source, drain, and gate regions of PFET and NFET devices having TEOS and HDP isolation regions in place.

The location of the HDP and the TEOS stress inducing regions, in relation to the device regions, is also shown in FIG. 6. In FIG. 6, the NFET is surrounded by TEOS to produce tensile stresses in the NFET transversely and longitudinally. The PFET of FIG. 6 illustrates TEOS fabricated on transverse sides of the PFET, to produce transverse tensile vectors, and HDP fabricated on longitudinal sides of the PFET to produce longitudinal compression vectors in the PFET. This structure results in enhanced performance for both the NFET and PFET simultaneously.

Figure 2:
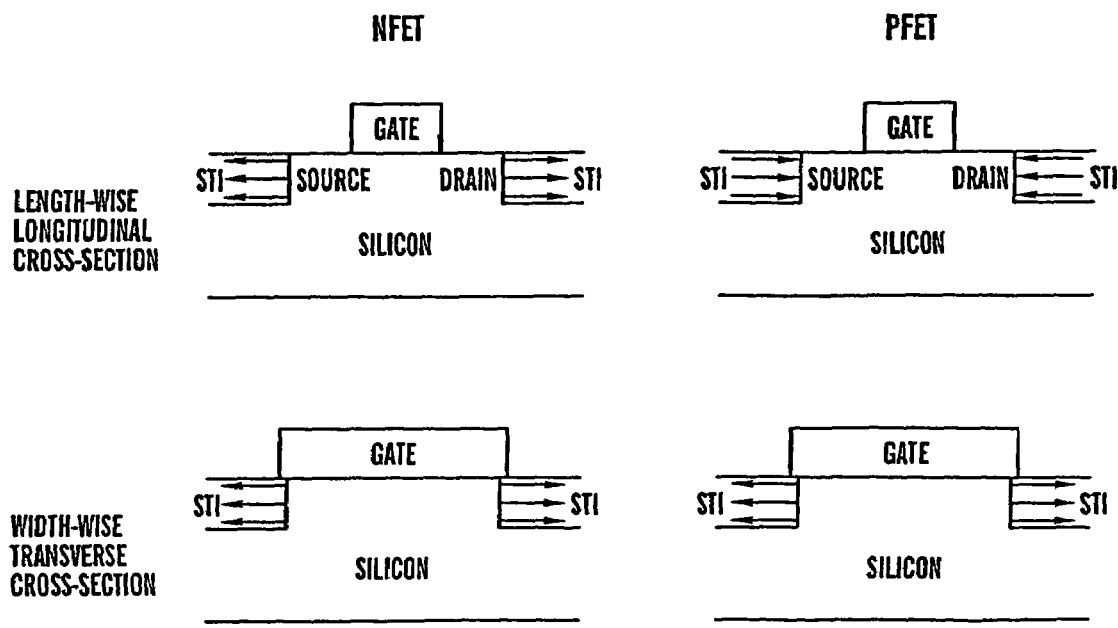
FIG. 2 illustrates cross section views of the devices of FIG. 1 along length and width planes.

FIG. 2 illustrates the compression/tension vectors described above in cross-section views. The cross-section views illustrate the FET gates fabricated on the device substrate above the device channel regions. In the NFET, both transverse and longitudinal tensile stress in the channel substrate is shown by the outwardly pointing arrows indicating the direction of stress. In the PFET, tensile stress is indicated in the transverse direction while compressive stress (inwardly pointing arrows) is indicated in the longitudinal direction. Taken together, the preceding figures clearly illustrate the tensile and compressive forces in the FET devices in all three dimensions.

In the simultaneous PFET/NFET embodiment of the present invention, the NFET and PFET can be used together simultaneously, for example, in a ring oscillator. The ring oscillator performs ideally when beneficial aspects of the present invention in both devices are balanced, i.e. charge mobility is equivalently enhanced. Another structural use for the present invention includes formation of the silicon source and drain regions in "island" configurations, wherein a substrate device area is surrounded by dielectric STI material, or in SOI (silicon-on-insulator) devices.

HDP and TEOS

The two preferred trench isolation materials, HDP and TEOS, differ in several aspects. The deposition processes of TEOS and HDP are different: TEOS deposition involves a CVD (chemical vapor deposition) process. HDP plasma deposition is a directional process wherein the material is accelerated by an electric field because, in the plasma, HDP is composed of charged particles. HDP has an intrinsic (as deposited) compressive stress and densities as part of its deposition process. TEOS requires a densification anneal after its deposition, but is intrinsically tensile.

The substrate stresses can be imparted because of shrinking/expansion of a stress inducing material or they can be imposed intrinsically when the stress inducing material is being grown adjacent to the substrate. HDP has a built-in intrinsic stress which is imparted to the substrate upon deposition (while the HDP is grown). Contraction occurs during heat treatment (densification) for TEOS. The underlying elemental mechanisms which induce stresses are not part of the present invention. Therefore, further theoretical details of those mechanisms will not be further addressed.

Process

The structure and choice of isolation materials, selected and formed in substrate regions surrounding FET devices for isolation, are novel. Generally speaking, a mask is used to open regions in the substrate. Next, a unique integration scheme is used to deposit TEOS and HDP in selected portions of the wafer. In one of several embodiments, the HDP regions are inlaid into a TEOS background.

The tensile components and the compressive components are decoupled. The tensile component is established first, by varying the densification process of the TEOS. Temperature and time can vary the stress built into the TEOS, which control the amount of shrinkage (800– 1050 C., 1 to 30 minutes, varying inversely). These variables determine how much the TEOS shrinks to some degree (densification). The TEOS molecules become more closely packed in densification and thereby cause tension in the adjacent Si island. The compression in the HDP $SiO_2$, is controlled mostly by the deposition conditions. Tuning of the compressive stress is achieved by control of RF the power. Increased power leads to more compression in the film. Pressure and Flow can also be used to modulate the compression in the HDP $SiO_2$ film.

Figure 3:
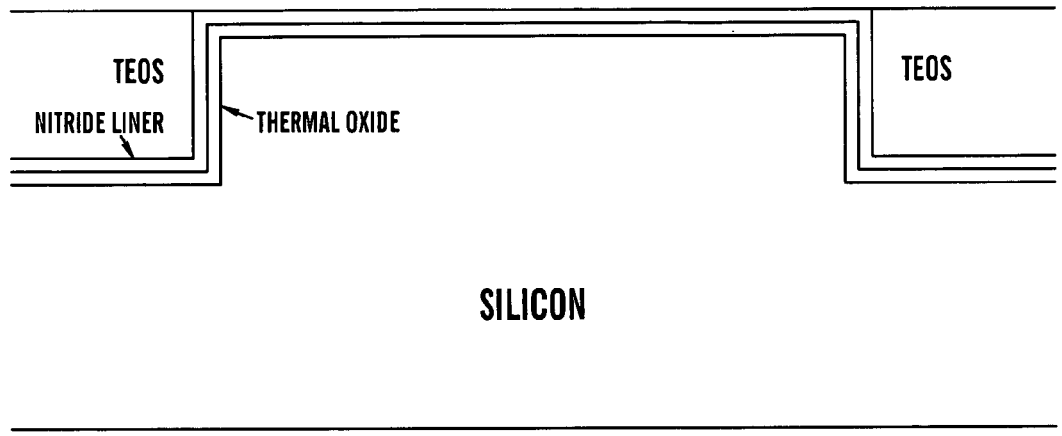
FIGS. 3–5 illustrate process steps for fabricating stressed NFET and PFET structures.
Figure 4:
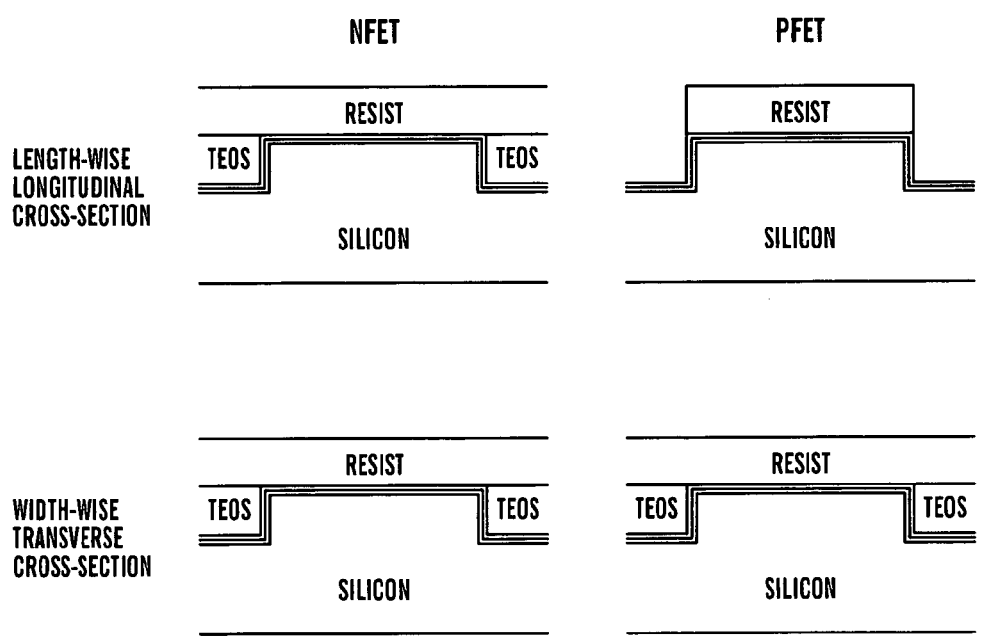
Figure 5:
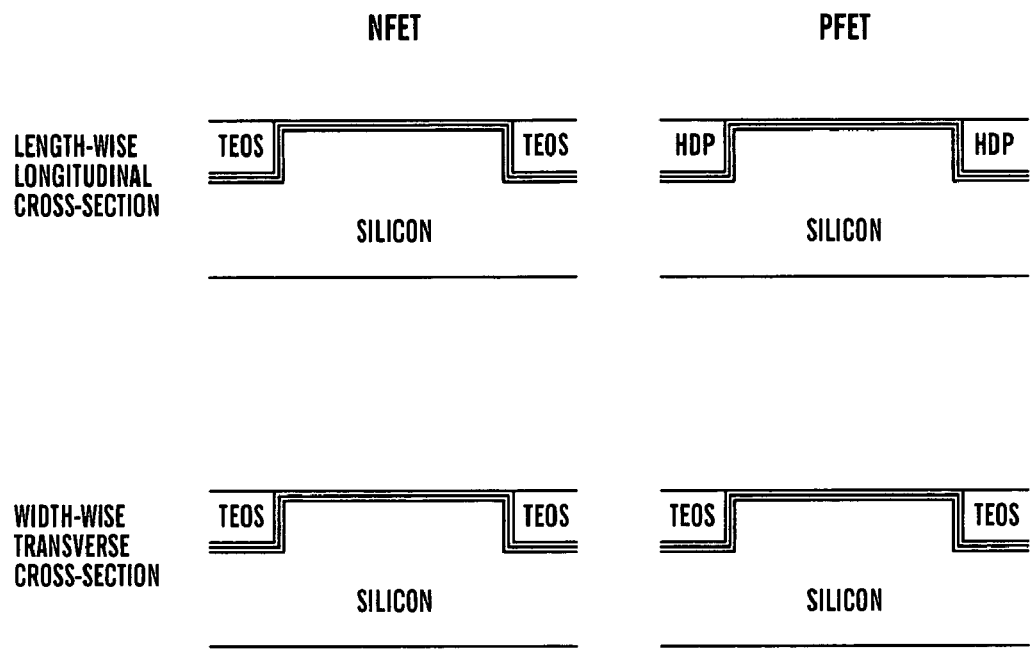

The process for fabricating NFETs and PFETs with different stresses in the channel region, on a common substrate is illustrated in FIGS. 3–5 and is described as follows. FIG. 3 illustrates formation of a silicon "island" surrounded by TEOS. The raised silicon area is the same for both PFETs and NFETs in both the lengthwise and widthwise cross sections. This raised silicon area is achieved by well known processes, which includes forming a pad layer (thin thermally oxidized pad), then depositing a SiN layer, then a mask is used to pattern openings in the SiN layer, then etching SiN, $SiO_2$ and finally silicon. After the mask is removed, a thermal oxidation, which provides a thin oxide layer on the exposed silicon, followed by a thin conformal nitride layer deposition to protect the silicon from oxidation during TEOS anneals (densification) and other anneals during processing. Blanket TEOS deposition followed by chemical-mechanical planarization ("CMP") down to the nitride liner surface results in the cross-section shown in FIG. 3.

Up to this point, the present inventive process follows conventional process steps. FIG. 4 illustrates the next steps of the process which provide the HDP in selected locations for the PFET in order to impart the desired longitudinal compressive stress. Using standard masking techniques, the NFETs are covered by the resist layer in the longitudinal and transverse aspects while the PFETs are covered only in the transverse direction, leaving the PFET TEOS uncovered in the longitudinal direction. This exposed TEOS is removed by an etch step (upper right of FIG. 4). This is the single masking step added by the present invention over conventional processes. The resist layer is then etched from the substrate surface, followed by HDP deposition and a final CMP step over the entire surface to achieve the structure shown in cross-section in FIG. 5, and shown in top view in FIG. 6. Conventional gate formation and processing steps follow in the normal course.

Figure 7:
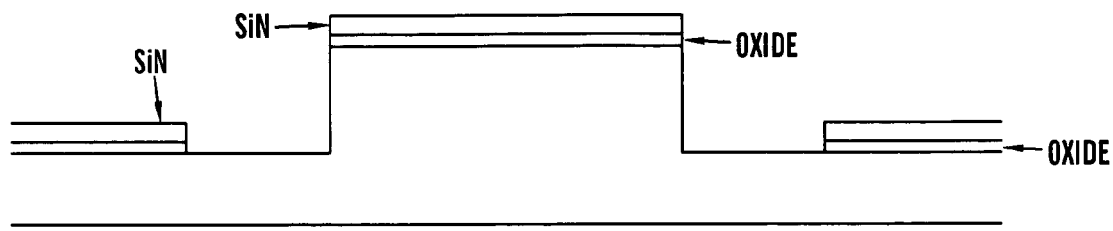
FIGS. 7–9 illustrate cross section views of a PFET structure that is fabricated using a second manufacturing method.
Figure 8:
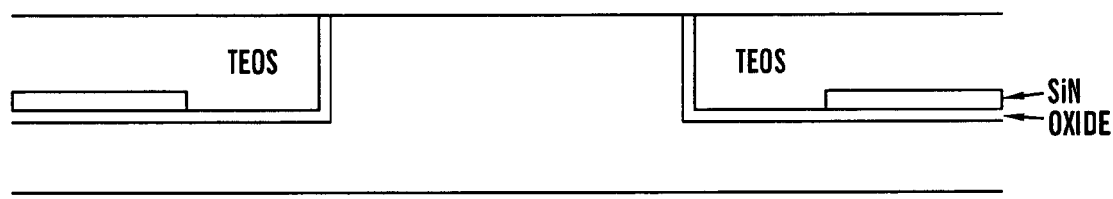
Figure 9:
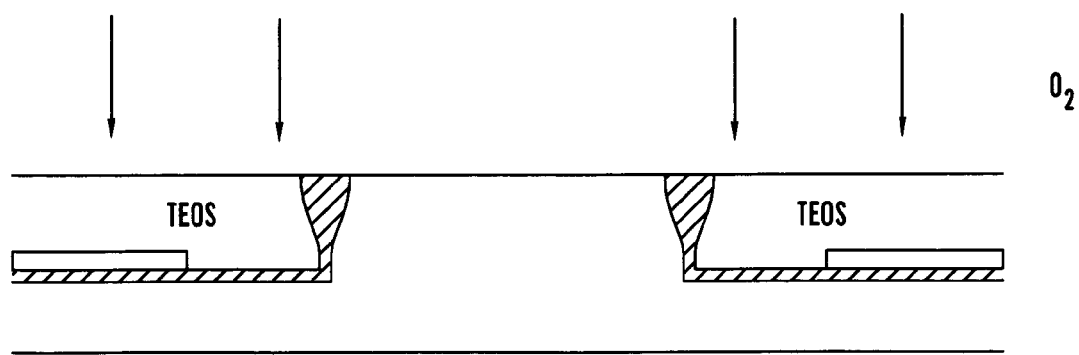

A second method for fabricating the structure of FIG. 1 and FIG. 2 proceeds as follows, and is shown in FIGS. 7–9. Following the same steps as in the previous process to achieve the structure shown in FIG. 3 only without the TEOS fill and CMP, another mask is then defined only for the longitudinal components of the PFET where we want to remove the nitride liner, similar to that shown in the upper right portion of FIG. 4.

Because we want to induce longitudinal compressive stress in the PFET, we remove the nitride liner surrounding the silicon island (it is removed from the PFET regions where compressive stress is desired). This allows oxygen to reach the silicon sidewalls during subsequent oxidation steps, and so in this aspect the nitride liner layer acts as an oxidation blocking layer. The nitride liner would block the oxidation, and thus the compression, because it is an excellent oxygen diffusion barrier. In areas where the SiN liner is removed, a portion of the Si on the sidewall of the Si island may be oxidized, thereby causing a controlled amount of compression in the direction longitudinal to current flow for the pFET. Good control in the oxide sidewall growth may be achieved using this method, because you can dial in the amount of compression achieved because of the amount of oxide grown, instead of relying on the HDP deposition conditions. The oxidation causes a compressive stress to be generated due to volume expansion on the sidewall of the Si island. The oxygen will diffuse through the TEOS oxidizing the silicon sidewall, growing a wedge of oxide and will push against the TEOS, causing the desired compression.

At this point, a silicon trench etch with corresponding hard masking produces the result as shown in FIG. 1, wherein the SiN layer is removed from the silicon island sidewalls. Next, an oxide liner is grown on the exposed silicon and TEOS is deposited, followed by a CMP step down to the SiN pad, followed by a SiN pad etch, and a $SiO_2$ pad etch—the pad etches remove SiN and oxide from the top of the silicon island—resulting in the structure shown in FIG. 8. Then, an oxidation step oxidizes a portion of the silicon island as shown in FIG. 9. In an alternate approach, the oxidation step is performed prior to pad nitride and oxide removal. It is known that when Si is transformed into $SiO_2$, a volume expansion of approximately 2.27:1 occurs. The oxidized material narrows with depth because as the oxygen diffuses downward, the concentration drops off due to oxygen consumption during the oxidation step. Thus, the oxygen concentration is higher at the top and it grows slightly thicker in the near surface region forming a wedge shape. The longer the oxidation, the wider the wedge. The idea is that the volume is expanded and compressive force pushes on the silicon inwardly. Conventional gate formation and processing follows and is not described further. It is to be noted that the device regions and isolation regions in these figures are not drawn to scale in any dimension.

ADVANTAGES OVER THE PRIOR ART

The benefit of using this scheme for achieving tension in the NFET and transverse component for PFET and compressive stress in the longitudinal component for the PFET is that the oxidation time and temperature can be used to tune the stress for the longitudinal component for the PFET.

In the prior art, Rim et. al. apply biaxial tension in strained silicon using a SiGe relaxed sub-layer. The problems there are many. While the NFET shows what may be considered significant improvement, they could not simultaneously improve both devices. Also, since the requirement is a relaxed SiGe layer, misfit dislocations are needed at the SiGe/Si interface. One of the major mechanisms by which the misfit dislocations are formed is from threading dislocations. Unfortunately, the threading dislocations can cause significant reliability, yield, and major leakage issues and are difficult to remove in practice.

*Mechanical Stress Effect of Etch-Stop Nitride and its Impact on Deep Submicron Transistor Design,* Ito et al (IEDM, 2000) impose stress using an etch-stop nitride superlayer that is deposited after the device is completely constructed. Again, here the films have a built-in intrinsic biaxial stress. They found that when the film is in compression NFET performance is degraded, while the PFET is enhanced. Also, they did not improve the performance of both the PFET and NFET simultaneously. Also, since the film is well above the device the stress translated down into the silicon will be somewhat lessened, particularly when compared to something that is directly adjacent the device.

The present solution shows how to apply the correct states of stress through modifying the STI process to benefit both the NFET and PFET simultaneously. It also differs substantially from both of these other approaches since the tension and compression are done through the STI structure and process whereas prior art listed above shows the stress is imposed through strained Si in one case and from intrinsic stress in a layer that comes well after the device build (and not adjacent the device as we do) in another.

The advantages of the method of the preferred embodiment of this invention include: device performance improvements for NFETs, PFETs, and for both NFETs and PFETs simultaneously by inducing in-plane stress patterns; a process readily integratible into present manufacturing processes for bulk silicon, silicon-on-insulator ("SOI"), and strained silicon structures; and improved devices be integrated into present processes cheaply for significant device performance improvements by adding a single mask step.

ALTERNATIVE EMBODIMENTS

It will be appreciated that, although specific embodiments of the invention have been described herein for purposes of illustration, various modifications may be made without departing from the spirit and scope of the invention. In particular, other isolation materials can be used, such as ceramics and silicon carbide, which can also impart intrinsic stresses. The general view of stresses in silicon is that it's disadvantageous. Stresses lead to ruptures or dislocations in the lattice structure, which lead to junction leakage, etc. In the present invention, we're intentionally building in a stress pattern.

As another example, nitride films can be readily modulated to have very high intrinsic stress. For example, as shown in Ito et al (IEDM, 2000) the PECVD nitride etch stop film stress could be modulated (by changing the deposition conditions such as $SiH_4/N_2/He$ flow rates, pressure, HF power, and electrode gap) between −1.4 GPa and +0.3 GPa. Of course, since nitride films have a higher dielectric constant, they will need deeper STI with perhaps larger isolation distances between devices. Hu (JAP, 1991) provides a partial listing of intrinsic stresses in some films. One could use a combination of highly intrinsic stressed films as part of the STI. This adds complexity, but allows for perhaps better tailoring of the stress.

Intrinsic stress is not the only way to add stress into this structural system. By choosing the correct materials with the appropriate thermal expansion coefficient mismatch, we can modulate the tensile stress. Since cool down is when the stress is imposed (operating conditions are between 25 C. and 85 C.), the net thermal mismatch stress will always be tensile. The magnitude of tensile stress is determined by the coefficients of thermal expansion. In the NFET tension in both dimensions (biaxial) is good, while for the PFET we would like to use this material property difference that causes tension only in the transverse direction, while still using a highly compressive intrinsic material in the longitudinal direction.

Nonconventional devices can also be fabricated using the present invention, such as pillar FETs and fin FETS. In a pillar FET, the body of the device is a cylindrical shape formed in a substrate with source/drain diffusions formed at the top and bottom of the cylinder. The gate region typically is adjacent to, or surrounds, the middle portion of the cylinder. A fin FET comprises a thin, elongated, raised substrate region with source and drain diffusions at the ends of the raised region. The gate is typically adjacent three sides of the raised region, the two vertical sides and the top surface of the raised region, between the source/drain diffusions. The general concept is to inlay isolation to produce a stress pattern at least in the channel region of the devices or at least in the source/drain diffusion regions. The appended claims are intended not to exclude various device geometries such as pillar FETs and fin FETs. Providing a uniform background of TEOS fill, then selectively opening regions for HDP deposition is a process that can accommodate device geometries other than those specifically illustrated in the present specification as preferred, currently known embodiments.

Accordingly, the scope of protection of this invention is limited only by the following claims and their equivalents.

We claim:

1. An isolation structure for devices formed in a substrate, the devices each having a longitudinal direction and a transverse direction, the structure comprising:

a first isolation region for a first one of the devices, the first isolation region having therein a first isolation material which applies a first type of mechanical stress on the first one of the devices in the longitudinal direction and also in the transverse direction;

a second isolation region for a second one of the devices, the second isolation region having therein the first isolation material which applies the first type of mechanical stress on the second one of the devices in the transverse direction; and a third isolation region for the second one of the devices, the third isolation region having therein a second isolation material which applies a second type of mechanical stress on the second one of the devices in the longitudinal direction, wherein the first one of the devices is an NFET and the second one of the devices is a PFET, and the first isolation material is TEOS and the second isolation material is HDP.

2. A method for making devices in a substrate, the devices each having sides extending in a longitudinal direction and ends extending in a transverse direction, the method comprising:

forming a first isolation region at the sides and at the ends of a first one of the devices;

providing a first isolation material in the first isolation region to apply a first type of mechanical stress on the first one of the devices in the longitudinal direction and in the transverse direction;

forming a second isolation region at the sides of a second one of the devices;

forming a third isolation region at the ends of the second one of the devices;

providing the first isolation material in the second isolation region to apply the first type of mechanical stress on the second one of the devices in the transverse direction; and providing a second isolation material in the third isolation region to apply a second type of mechanical stress on the second one of the devices in the longitudinal direction, wherein the first one of the devices is an NFET and the second one of the devices is a PFET, and the first isolation material is TEOS and the second isolation material is HDP.

* * * * *